United States Patent [19]

Kasperkovitz

[11] Patent Number: 4,547,744
[45] Date of Patent: Oct. 15, 1985

[54] INTEGRATED AMPLIFIER ARRANGEMENT
[75] Inventor: Wolfdietrich G. Kasperkovitz, Eindhoven, Netherlands
[73] Assignee: U.S. Philips Corporation, New York, N.Y.
[21] Appl. No.: 268,047
[22] Filed: May 28, 1981
[30] Foreign Application Priority Data Jun. 2, 1980 [NL] Netherlands ............ 8003197

[51] Int. Cl.⁴ ............................................. H03F 3/45
[52] U.S. Cl. ....................................... 330/261; 330/252
[58] Field of Search .................... 330/70, 71, 73, 252, 330/261, 307, 303, 306

[56] References Cited
U.S. PATENT DOCUMENTS
4,418,321 11/1983 Böhme ............................ 330/260 X OTHER PUBLICATIONS
Choma, "Actively Peaked Broadbanded Monolithic Amplifier", IEE Proceedings, vol. 127, No. 2, Apr. 1980, pp. 61-66.

Primary Examiner—James B. Mullins
Assistant Examiner—G. Wan
Attorney, Agent, or Firm—Robert T. Mayer; Steven R. Biren

[57] ABSTRACT

An integrated amplifier arrangement in which the d.c. voltage gain is suppressed, which includes two transistors arranged as a differential pair with an output between the collectors of these transistors. In order to improve the high-frequency properties of the amplifier arrangement, the collector circuit of the transistors includes two load transistors in cascade with the two transistors arranged as a differential pair, each load transistor including an impedance in its base circuit in order to obtain an inductive input impedance on the emitter side of the transistor. In order to obtain direct-current and low-frequency negative feedback for eliminating the d.c. gain, the base electrodes are cross-coupled to the collector electrodes of the load transistors.

7 Claims, 4 Drawing Figures

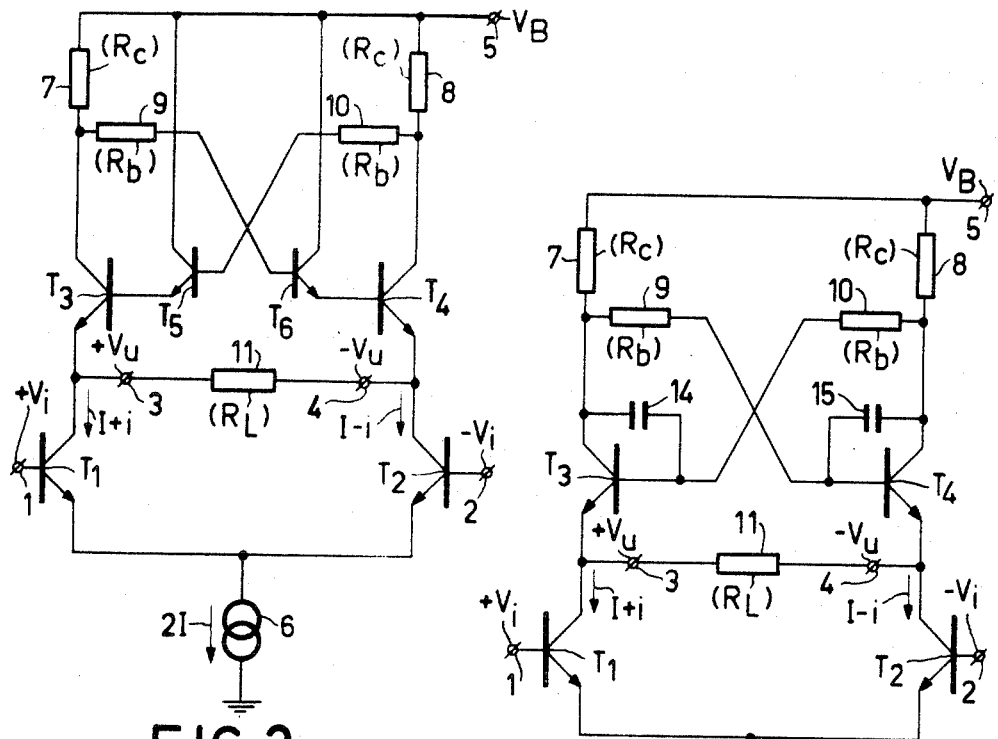
FIG.2
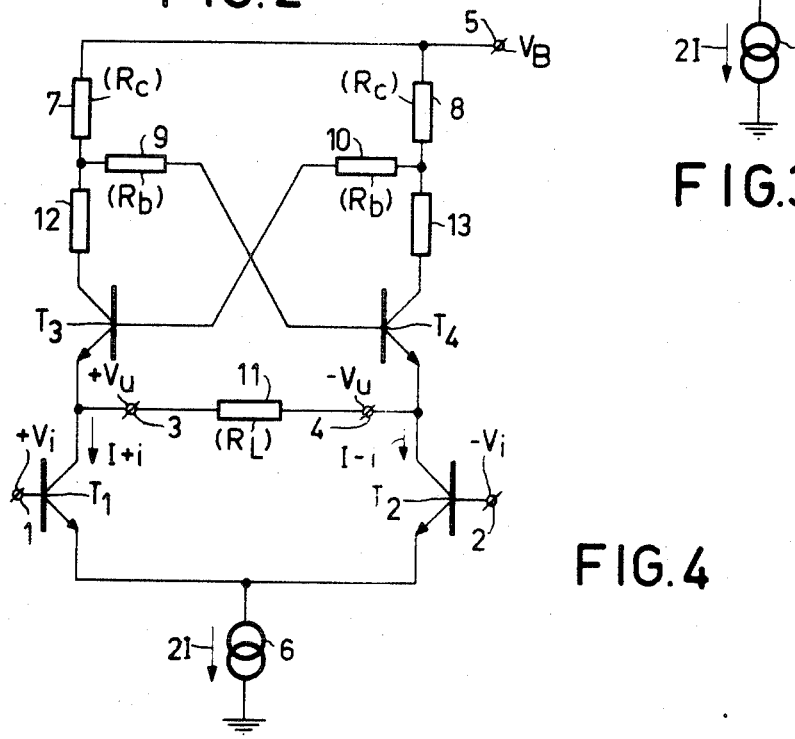
FIG.3
FIG.4

INTEGRATED AMPLIFIER ARRANGEMENT

BACKGROUND OF THE INVENTION

The invention relates to an integrated amplifier arrangement, comprising a first and a second transistor, whose base electrodes lead to an input of the amplifier arrangement, whose emitter electrodes are coupled to each other, and whose collector electrodes lead to an output of the amplifier arrangement, which output is loaded by an output impedance, and via a load circuit to a supply terminal, the load circuit, in order to increase the gain at higher frequencies, comprising a third and a fourth transistor of the same conductivity type as the first and the second transistor, of which third and fourth transistor the respective main current path is connected in series with the main current path of the first and the second transistor, respectively, in that the emitter electrode of the third and the fourth transistor, respectively, is coupled to the collector electrode of the first and the second transistor, respectively, and the collector electrode of the third and the fourth transistor, respectively, is connected to said supply terminal via a first and a second impedance respectively, a third and a fourth impedance, being included in the base circuit of the third and the fourth transistor respectively.

Such an amplifier arrangement is known from an article by J. Choma in IEE Proceedings, Vol. 127, no. 2, April 1980, pages 61–66, entitled "Actively peaked broad-banded monolithic amplifier", in particular FIG. 7. In such an amplifier arrangement the inductive nature of the third and the fourth transistor, whose base circuits include the third and fourth impedance, is used to increase the gain and specific frequencies in order to compensate for the roll-off at higher frequencies owing to transistor characteristics and/or stray capacitances or even in order to peak the gain factor of the amplifier stage at specific frequencies. The base electrodes of said third and fourth transistors are then connected to a point of constant potential via said third and fourth impedances.

For various applications of high-frequency amplifiers, such as tuning circuit in, for example, television receivers, the amplifier should exhibit no low-frequency gain. As a result of d.c. and low-frequency gain any d.c. input voltages—caused by unequal settings of the first and the second transistor or by circuits preceding the first and the second transistor—appear amplified at the output, so that d.c. coupling to a following circuit with differential input is not readily possible. A solution for this is a capacitive coupling to the next circuit, but this has the drawback that the integrated circuit should be provided with additional terminals for the connection of the two capacitors required for this, that external components are necessary, that this results in high-frequency radiation and that the risk of instability thereby increases. Another possible solution is to eliminate the d.c. gain by means of low-frequency negative feedback via an at least partly external RC-network, which has similar drawbacks.

Due to these drawbacks it is difficult to combine sensitive high-frequency amplifiers on a single semiconductor substrate with other circuits such as frequency dividers, for example for television tuners.

Since several circuits are typically incorporated on a single semiconductor substrate it is moreover of importance to minimize the number of components and the power dissipation.

SUMMARY OF THE INVENTION

It is the object of an invention to provide an amplifier arrangement of the type mentioned above, in which the d.c. voltage gain is eliminated without the necessity of external components and with a minimum of components and a minimum power dissipation.

The invention is therefore characterized in that the base electrode of the third transistor is connected to the collector electrode of the fourth transistor via said third impedance and the base electrode of the fourth transistor is connected to the collector electrode of the third transistor via said fourth impedance.

In accordance with the invention this interconnection eliminates the d.c. voltage gain since a variation of the direct current in one of the collector circuits of the first and the second transistor can compensate for the voltage variation on the collector of the other one of said first and second transistors via the cross-coupled third and fourth transistors. The high-frequency gain is not eliminated thereby, because of the inductive nature of the third and the fourth transistor, so that the impedance of the load circuit constituted by the third and the fourth transistor increases with frequency and the signal current flows via a load between the collectors of the first and the second transistors. Moreover, the invention requires no additional components, but even reduces the number of components in that the d.c. bias source required for the base electrodes of the third and the fourth transistor in the known circuit has become redundant.

BRIEF DESCRIPTION OF THE DRAWING

The invention will now be described in more detail with reference to the Drawing, in which FIGS. 2, 3 and 4 show second, third and fourth embodiments of an amplifier arrangement in accordance with the invention.

DESCRIPTION OF THE PREFERRED EMBODIMENT

Figure 1:
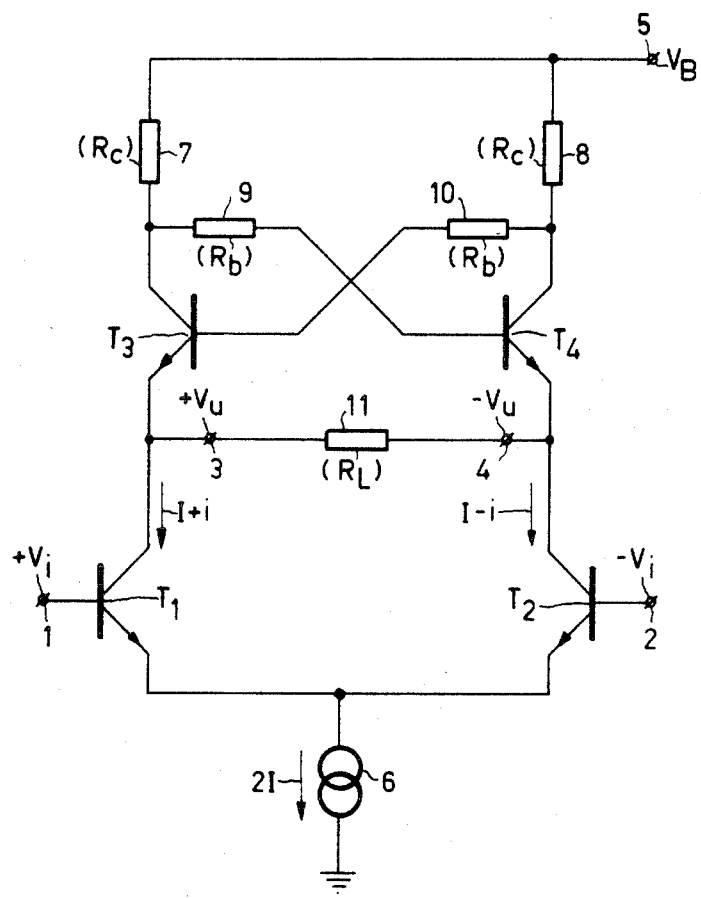
FIG. 1 shows a first embodiment of an amplifier arrangement in accordance with the invention.

The arrangement of FIG. 1 comprises a first ($T_1$) and a second ($T_2$) transistor, which are connected as a differential amplifier in that the emitter electrodes are connected to a quiescent current source 6, which carries a current $2I$. The base electrodes are connected to a differential input 1, 2. The collector electrodes lead to an output 3, 4 between which a load 11, with a resistance $R_L$, is included, which load 11 may be constituted by the input of a subsequent circuit. The respective collector electrodes of transistors $T_1$ and $T_2$ are connected to a supply terminal 5 via the emitter-collector paths of transistors $T_3$ and $T_4$, respectively, in series with an impedance 7 and 8, respectively, each having a resistance $R_c$ in the present example. The base electrode of transistor $T_3$ is connected to the collector of transistor $T_4$ via an impedance 10, with a resistance $R_b$ in the present example, and the base electrode of transistor $T_4$ is connected to the collector of transistor $T_3$ via an impedance 9, having a resistance $R_b$ in the present example.

For direct currents and signal currents of comparatively low frequency the emitter input impedance of transistors $T_3$ and $T_4$ is comparatively low relative to the load 11. The collector direct currents and low-frequency alternating currents of transistors $T_1$ and $T_2$ thus mainly flow via the emitter-collector paths of transistors $T_3$ and $T_4$.

If the currents in the collector circuits of transistors $T_1$ and $T_2$ are $I+i$ and $I-i$ respectively, where i is the component as a result of an input direct-voltage difference $2 V_i$ or an inequality in the transistors $T_1$ and $T_2$, the following relation is valid for the voltage $V_u$ on output terminal 3—and the opposite for the voltage on output terminal 4—caused by the d.c. component i:

$$V_u = ir_o + R_b(i/\beta) + R_c(i/\beta) - iR_c + (i/\beta)R_c$$

where $\beta$ is the current gain factor of the transistors $T_3$ and $T_4$ and $r_o$ is the differential d.c. resistance of the base-emitter junctions of transistors $T_3$ and $T_4$. Thus, this voltage $V_u$ comprises the voltage $ir_o$ across the base-emitter junction of transistor $T_3$, the voltage $i(R_b+R_c)/\beta$, caused by the base current of transistor $T_3$ across the impedances 10 and 8, and the voltage $$iR_c\left(1 - \frac{1}{\beta}\right)$$

caused by the collector current of transistor $T_3$ across impedance 8. This voltage as a result of the differential d.c. component i can be reduced to zero by selecting the various parameters in such a way that:

$$r_o + \frac{R_b}{\beta} - \left(1 - \frac{2}{\beta}\right) R_c = o.$$

If $r_o = 25$ mV/I, the requirement for eliminating the difference in output direct voltage will be:

$$I\left(1 - \frac{2}{\beta}\right) R_c - \frac{R_b}{\beta} = 25 \text{ mV}.$$

This requirement can be met by a suitable choice of the three parameters I, $R_c$ and $R_b$. This leaves sufficient degrees of freedom to optimize the high-frequency behavior of the circuit without adversely affecting the elimination of a d.c. difference.

For signal currents of higher frequencies, the emitter input impedance of the transistors $T_3$ and $T_4$, which when arranged as shown have an inductive nature, increases and an amplified signal voltage is produced across the output impedance 11.

In the circuit arrangement shown in FIG. 1 the base direct current through the base resistors 9 and 10 can be reduced by the use of a Darlington configuration for the transistors $T_3$ and $T_4$, as shown by transistors $T_3/T_5$ and $T_4/T_6$ in FIG. 2. A further step to optimize the high-frequency behavior and the d.c. behavior more or less independently of each other is to arrange Miller capacitances 14 and 15 across the transistors $T_3$ and $T_4$ as shown in FIG. 3. Alternatively, it is possible to arrange additional resistors 12 and 13 in the collector circuits of the transistors $T_3$ and $T_4$ between the collectors and the connections of the base resistors 9 and 10, as shown in FIG. 4.

What is claimed is:

1. An integrated amplifier arrangement, comprising a first and a second transistor, whose base electrodes lead to an input of the amplifier arrangement, whose emitter electrodes are coupled to each other, and whose collector electrodes lead to an output of the amplifier arrangement, which output is loaded by an output impedance, and via a load circuit to a supply terminal, the load circuit, in order to increase the gain at higher frequencies, comprising a third and fourth transistor of the same conductivity type as that of the first and the second transistors, the main current path of said third and fourth transistor, respectively, being connected in series with the main current path of the first and second transistor, respectively, the emitter electrode of the third and the fourth transistor, respectively, being connected to the collector electrode of the first and the second transistor, respectively, and the collector electrode of the third and the fourth transistor, respectively, being connected to said supply terminal via a first and a second impedance, respectively, a third and fourth impedance being included in the base circuit of the third and the fourth transistor, respectively, characterized in that the base electrode of the third transistor is connected to the collector electrode of the fourth transistor via said third impedance and the base electrode of the fourth transistor is connected to the collector electrode of the third transistor via said fourth impedance.

2. An integrated amplifier arrangement as in claim 1, wherein said third and fourth transistors each comprise a Darlington pair.

3. An integrated amplifier arrangement as in claim 1, further comprising Miller capacitances provided across said third and fourth transistors.

4. An integrated amplifier arrangement as in claim 1, further comprising a fifth impedance connected between the collector electrode of said third transistor and said first and fourth impedances, and a sixth impedance connected between the collector electrode of said fourth transistor and said second and third impedances.

5. A feedback amplifier comprising a current fed differential stage, a first transistor having an emitter connected to a first output of said differential stage, a second transistor having an emitter connected to a second output of said differential stage, a first resistor connected between both said first and second outputs of said differential stage, a third resistor forming an operating resistor connected between a supply voltage and the collector of said first transistor and the base of said second transistor and a fourth resistor forming an operating resistor connected between said supply voltage and the collector of said second transistor and the base of said first transistor.

6. A feedback amplifier including a current-fed differential stage having first and second outputs, said feedback amplifier additionally comprising a first transistor having an emitter connected to the first output of the differential stage; a second transistor having an emitter connected to the second output of the differential stage; a first resistor connected between both the outputs of the differential stage; a source of supply voltage; and second and third resistors comprising operating resistors connected between said supply voltage source and said two transistors, wherein said second resistor is connected to the collector of said first transistor and the base of said second transistor, and said third resistor is connected to the collector of said second transistor and the base of said first transistor.

7. A feedback amplifier as defined in claim 6, and comprising a fourth resistor connecting the base of said first transistor to the collector of said second transistor and a fifth resistor connecting the base of said second transistor to the collector of said first transistor.

* * * * *